United States Patent [19]

Bobeck et al.

[11] Patent Number: 4,870,649
[45] Date of Patent: Sep. 26, 1989

[54] TRANVERSE MODE CONTROL IN SOLID STATE LASERS

[75] Inventors: Andrew H. Bobeck, Chatham; Lloyd R. Harriott, Hillsborough Township, Somerset County; Robert L. Hartman, Warren Township, Somerset County; Daniel R. Kaplan, Springfield; George J. Przybylek, Washington, all of N.J.; William J. Tabor, Lower Macungie Township, Lehigh County, Pa.

[73] Assignee: American Telephone and Telegraph Company, AT&T Bell Laboratories, Murray Hill, N.J.

[21] Appl. No.: 290,780

[22] Filed: Dec. 28, 1988

[51] Int. Cl.$^4$ ............................................. H01S 3/098
[52] U.S. Cl. ...................................... 372/19; 372/49; 372/46; 372/44; 372/99; 372/103
[58] Field of Search ..................... 372/19, 49, 46, 99, 372/103, 98, 44

[56] References Cited

U.S. PATENT DOCUMENTS

| | | | |
|---|---|---|---|
| 3,868,589 | 2/1975 | Wang | 372/20 |
| 4,084,130 | 4/1978 | Holton | 372/50 |
| 4,496,518 | 1/1985 | Marie | 372/19 |
| 4,516,243 | 5/1985 | Utaka et al. | 372/19 |

FOREIGN PATENT DOCUMENTS 0068090  6/1978  Japan ..................................... 372/19

OTHER PUBLICATIONS

Smith et al., "High-Power Single-Frequency Lasers Using Thin Metal Film Mode-Selection Filters," The Bell System Technical Journal, vol. 48, No. 5, May–Jun. 1969, pp. 1405–1419.

Applied Physics Letters, vol. 18, #12, Jun. 15, 1971; pp. 565–567, "Efficient Wire-Grid Duplexer Polarizer for $CO_2$ Laser", P. K. Cheo et al.

Applied Optics, Jun. 1967, vol. 6, No. 6; pp. 1023–1027; J. P. Auton, "Infrared Transmission Polarizers by Photolithography".

The Encyclopedia of Physics, Third Edition, R. M. Besancon, p. 952.

Primary Examiner—William L. Sikes
Assistant Examiner—Georgia Yvonne Epps
Attorney, Agent, or Firm—M. J. Urbano

[57] ABSTRACT

A reflection filter is disposed on a solid state laser so as to preferentially reflect TE or TM modes and to suppress oscillation within the resonator of the non-reflected modes. In one embodiment, the filter includes a layer having a plurality of grooves which may be straight and parallel or curved to approximate the mode shape. In another embodiment, the filter includes a polarization sensitive film, without grooves, which either absorbs or transmits the undesired mode. Specifically described is a buried heterostructure semiconductor DFB laser with such a reflection filter formed on at least one facet thereof.

19 Claims, 3 Drawing Sheets

TRANVERSE MODE CONTROL IN SOLID STATE LASERS

BACKGROUND OF THE INVENTION

This invention relates to mode control in solid state lasers and, more particularly, to such lasers which favor operation in either the transverse electric (TE) mode or the transverse magnetic (TM) mode and discriminate against the other.

On form of solid state laser is the buried heterostructure (BH) semiconductor laser which is the optical source of choice in most lightwave communications systems, especially long haul transmission systems operating at high bit rates (e.g., above 1 Gb/s). Typically BH lasers operate in the fundamental TE mode because the waveguide characteristics of the active layer (asymmetric cross-section and refractive index relative to that of the cladding layers) tend to support operation in a TE mode and suppress operation in a TM mode.

The suppression of the TM modes, however, is incomplete; during operation of the laser in a TE mode, occasionally the laser will switch to operation in a TM mode or in both a TM and a TE mode. The random occurrence of the TM mode is a statistical process and represents a form of noise; each occurrence of a TM mode may constitute an error in systems incorporating the laser. The number of such errors is measured, in digital systems, by the number of pulses which are incorrectly detected as logical "1" when in fact a logical "0" was transmitted, or conversely. The number of such erroneously detected pulses is known as the bit error rate (BER).

Generally, the higher the system bit rate, the lower the BER which may be required. Thus, for example, at a system bit rate of 1.7 Gb/s the required BER may be as low as $10^{-14}$; i.e., only one error in $10^{14}$ pulses occurs.

Stringent BER criteria have an adverse effect on the ability to manufacture semiconductor lasers with acceptable yields; the lower the BER, the lower the yield, in general.

Thus, there is a need for a semiconductor laser design in which TM modes are sufficiently suppressed to enable lasers with low BERs to be manufactured with acceptable yields.

SUMMARY OF THE INVENTION

In accordance with one aspect of the invention, oscillation of TM or TE modes within the resonator of a solid state laser is suppressed by filter means disposed on at least one surface of the laser on which the mode is incident. The filter means preferentially reflects either TE or TM modes so that oscillation of the non-reflected (i.e., transmitted or absorbed) mode within the laser resonator is suppressed.

In one embodiment, the filter means comprises a single-layered or multi-layered structure in which a plurality of grooves are formed in at least the region of the structure which overlaps the portion of the surface on which the mode is incident.

An illustrative embodiment of the invention is adapted to suppress the TM modes of a stripe geometry BH laser, in which a stripe-shaped waveguide layer has an asymmetric cross-section which tends to favor TE modes over TM modes. The waveguide layer, as used herein, is intended to embrace the active layer itself, waveguiding layers optically coupled to the active layer, or to a combination of the two. In this embodiment the grooves extend in the direction of the longer dimension of the cross-section; the grooves may be a series of parallel grooves or, to provide better match to curved mode shape, may be a series of curved grooves.

Of particular significance is the application of the principles of the invention to distributed feedback (DFB) semiconductor BH lasers which are preferred as single frequency sources for high bit rate (e.g., >1 Gb/s) lightwave systems. DFB-BH lasers are extremely difficult to manufacture with acceptable yields (often a fraction of 1%) so that the enhanced TM mode suppression provided by the instant invention offers the possibility of improved laser yields from a BER standpoint.

In another embodiment, the filter means includes a polarization sensitive film, such as an oriented polymer, which preferentially reflects the desired mode, thereby allowing the reflected mode to oscillate in the resonator. The film also has a high transmissivity for the undesired mode, thereby suppressing its oscillation in the resonator. Alternatively, the film may absorb the undesired mode, thereby suppressing its oscillation, and transmit the desired mode. But, in the latter case, a reflecting layer is disposed adjacent to the film to reflect the desired mode, thereby sustaining its oscillation within the resonator.

BRIEF DESCRIPTION OF THE DRAWING(S)

The invention, together with its various features and advantages, can be readily understood from the following more detailed description in conjunction with the accompanying drawing in which, in the interests of simplicity and clarity, the figures have not been drawn to scale:

FIG. 1 is a schematic, isometric view of a solid state laser in accordance with an illustrative embodiment of the invention in which the filter means includes a layer having straight, parallel grooves;

FIG. 2 depicts alternative, curved shapes of the grooves which form part of an alternative embodiment of the filter of FIG. 1; and FIGS. 3 and 4 are schematic, side views of solid state lasers in accordance with yet other embodiments of the invention in which the filter means includes a polarizing film; and FIG. 5 is a schematic, isometric view of a buried heterostructure laser to which the principles of the invention can be usefully applied.

DETAILED DESCRIPTION

Figure 1:
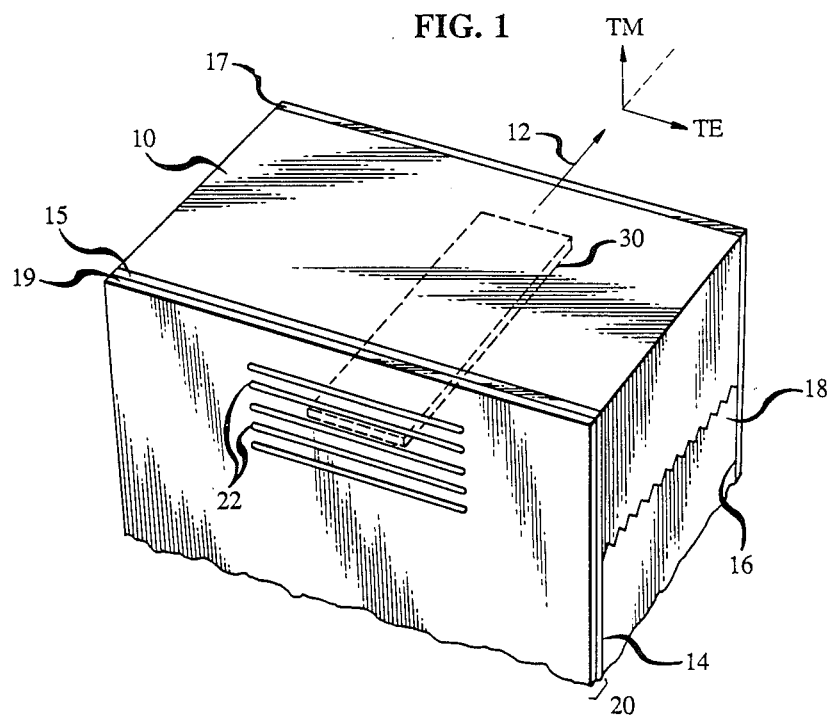

Turning now to FIG. 1, there is shown a solid state laser comprising a solid state body 10 capable of generating laser radiation 12 which, in general, oscillates in TE or TM modes, or both. The radiation is incident on a region of at least one surface 14 of body 10. In accordance with one aspect of the invention, a reflection filter 20 is located on surface 14 so as to preferentially reflect either TE or TM modes and to suppress the non-reflected modes; that is, the non-reflected modes do not oscillate within the optical resonator of the laser. Filter 20 is single-layered or multi-layered structure in which a plurality of grooves 22 are formed so as to overlap the region of surface 14 on which the radiation is incident. The pitch of the grooves (or of the interleaved stripes formed thereby) is typically about $\lambda/2$, where $\lambda$ is measured in the material in which the grooves are formed. The specific pitch chosen, whether greater or smaller than λ/2, depends on the curvature of the wavefront and on the desired reflectivity. The latter in turn depends on other considerations. For example, if the reflectivity is too high the light intensity distribution in the resonator may be overly asymmetric. On the other hand, a smaller pitch, hence higher reflectivity, may be desired for curved wavefronts. The trade offs, however, can be readily handled by those skilled in the art. In addition, although the term pitch, above, implies that the grooves are spaced uniformly, that is not essential. It may be desirable to utilize non-uniform spacing in which the average spacing achieves reflection of the desired mode; e.g., the average spacing may be approximately λ/2.

The direction in which the grooves extend depends on whether TE modes or TM modes are to be suppressed; thus, the direction of the grooves is essentially perpendicular to the direction of polarization of the modes to be suppressed. In addition, the shape of grooves may have varied geometries. The straight, parallel grooves of FIG. 1 are sufficient for many applications, but where the mode to be suppressed has a curved rather than a plane wavefront, it may be desirable to bend the grooves so as to approximate the curved wavefront, as shown by the curved segments in FIG. 2.

In one embodiment of the invention, the solid state body has a stripe-shaped dielectric waveguide 30 which may also include an active region from which laser radiation is generated by suitable electrical (or optical) pumping means not shown, but well known in the art. Waveguide 30 has a higher refractive index than the cladding regions which surround it, and, in addition, typically has an asymmetric cross-section. The longer dimension of the crosssection extends horizontally. The combined effect of the refractive index profile and shape of the waveguide 30 would (in the absence of filter means 20) cause the laser to favor operation in a TE mode, usually the fundamental TE mode but not exclusively so—the TM modes are often inadequately suppressed depending on the required BER. As shown in FIG. 1, the TE mode is polarized along the longer cross-sectional dimension of waveguide 30, whereas the TM modes are polarized perpendicular thereto. Accordingly, adequate suppression of the TM modes is achieved by orienting the grooves 22 of reflection filter means 20 parallel to the longer dimension of the cross-section; i.e., parallel to the direction of polarization of the TE modes and perpendicular to the direction of polarization of the TM modes. Consequently, the TE mode is reflected and the TM mode is not. Since optical feedback for the TM mode is significantly decreased, the likelihood that it will oscillate is greatly reduced. Conversely, if it were desired to suppress the TE modes, then the waveguide would be designed to favor the desired TM mode, and the grooves would be oriented parallel to the polarization of the TM mode.

In a preferred embodiment of the invention, laser 10 operates as a single frequency source. Nominally, the frequencies (wavelengths) at which the laser operates are determined by the composition of its active region and the number of such frequencies which exhibit net gain. From among these frequencies, a single frequency is selected by suitable DFB means such as grating 18 which is optically coupled to radiation propagating in waveguide 30. The waveguide 30 extends perpendicular to parallel surfaces 14 and 16 which, together with grating 18, form an optical resonator. Suitable low reflectivity coatings 15 and 17 are located on surfaces 14 and 16, respectively. Preferably coating 15 is an antireflection (AR) coating which is illustratively λ/4 thick (or an odd multiple thereof). On at least one of the coatings 15 a higher refractive index material or a metal layer 19 is disposed, so that the composite, multi-layered structure of layers 15 and 19 forms a reflection filter. To achieve filtering, grooves 22 are formed in layer 19 by any suitable technique, such as ion-milling, which does not damage the underlying active layer. The grooves illustratively extend through layer 19 and expose the underlying portion of layer 15. A passivation coating (not shown) may be formed over the grooves.

Figure 5:
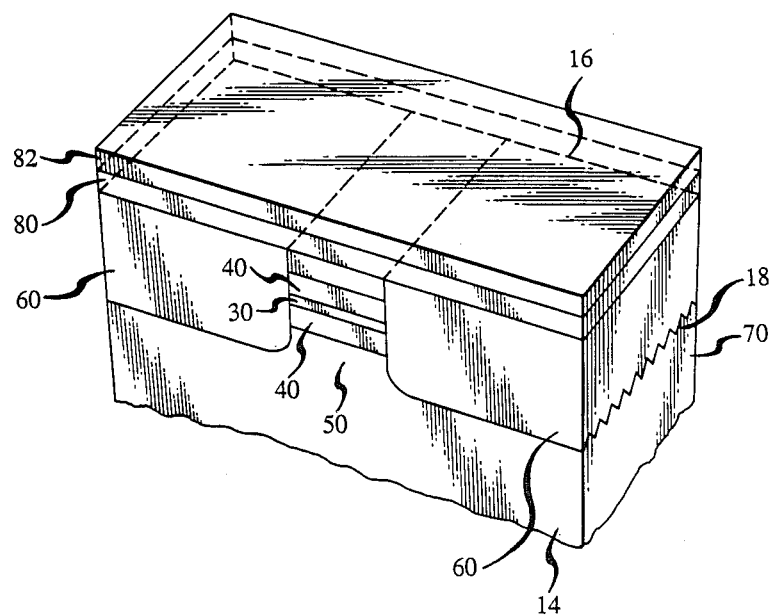

Illustratively, the single-frequency laser 10 is a BH-DFB semiconductor laser. One advantageous design of such a laser is the covered (or capped) mesa buried heterostructure (CMBH) shown in FIG. 5. Other designs, however, such as etched mesa buried heterostructures (EMBH) can also be used. In an exemplary design of the CMBH, the waveguide 30 includes a relatively narrow bandgap (high refractive index) semiconductor active layer sandwiched between higher bandgap (lower refractive index) cladding layers 40 in a mesa 50 disposed on a substrate 70. The cladding layers have opposite conductivity types The waveguide has the shape of a stripe with an asymmetric cross-section. The longer dimension of the cross-section extends parallel to the plane of the layers. Adjacent to the side walls of the mesa are current-blocking regions 60, typically semi-insulating semiconductor, which are flush with the top of the mesa. This structure is capped with contact-facilitating layers 80 and 82. To provide DFB, grating 18 is formed on substrate 70. In the interests of simplicity, the electrical contacts to the substrate 14 and layer 82 have been omitted but are well known in the art.

The front and back surfaces 14 and 16 of the CMBH are typically parallel cleaved facets on which the low reflectivity coatings (not shown in FIG. 5) are formed. The higher refractive index material or metal layer (also not shown in FIG. 5) used for the filter means (FIG. 1) is formed on at least one of these coatings. This type of laser design tends to favor the fundamental TE mode, and, so, the grooves would extend along the longer dimension of the waveguide 30, thereby to preferentially reflect the TE mode.

The CMBH is commonly a 1.55 μm laser fabricated from the InP/InGaAsP materials system; that is, the waveguide layer 30 includes an InGaAsP active layer with its composition chosen to emit laser radiation at about 1.55 μm. The cladding layers 40 may comprise InP, but at least one typically includes a well-known quaternary anti-meltback layer grown on the active layer. The blocking regions preferably comprise semi-insulating Fe-doped InP, and, when starting with an n-type InP substrate 70, the contact-facilitating layers comprise p-InP layer 80 and p-InGaAsP layer 82. The AR coatings on surfaces 14 and 16 illustratively comprise amorphous zirconia, an the metal layer in which the grooves are formed illustratively comprises Cr, Al, Au or Pt. The grooves are formed by focused ion beam milling using, as an exemplary ion species Ga ions, focused to a submicron spot and scanned to remove portions of the metal layer and to form by physical sputtering grooves of the desired shape and orientation.

Experiments were performed on 1.55 μm InP/InGaAsP DFB lasers of the CMBH type described above. The laser chips were about 250 μm long (resonator length) and 500 μm wide (facet width). The active layer cross-section was about 1 μm wide and 0.15 μm thick. On each facet an amorphous zirconia AR coating about 2100 Å thick was formed. On the rear facet a Au layer about 400 Å thick was deposited, and straight grooves parallel to the 1 μm dimension of the active layer were formed in the AU layer by Ga ion beam milling. The Ga ion beam had an energy of 20 keV, a dose of about $3 \times 10^{17}/cm^2$, and was focused to a spot size of about 2000 Å. (Equipment which produces smaller beam spots, e.g., 500 Å, is also available.) The ion beam was used to form grooves which were 2000 Å wide, 25 μm long with a pitch of about 4000 Å. The grooves were located in a region measuring about 25 μm wide by 8 μm high which overlapped the end of the active layer.

Both DC and pulsed tests were performed on the lasers. In the DC tests the L-I (light power vs. current) characteristics demonstrated that the TM modes were essentially not present; that is, the TM mode threshold was not observed in the L-I measurements in which the current ranged as high as 200 mA, and the TM mode power was more than 35 dB below the TE mode. The pulsed tests were performed on lasers which initially (without a reflection filter) were extremely poor (ver high BERs of, say, $10^{-2}$), but after the filter was incorporated had dramatically improved BERs of $10^{-8}$ at 1.7 Gb/s. Even lower BERs are anticipated by applying the principles of the invention to lasers which initially have better, yet perhaps unacceptable, BERs such as $10^{-8}$. In general, however, lower BERs of, say, $10^{-14}$ are also expected as the laser design evolves. This evolution might involve choice of the metal in which the grooves are formed, and/or details of the ion milling process (e.g., choice of pitch and spacing-to-width aspect ratio of the stripes which are formed between the grooves of the filter means of FIG. 1).

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

Figure 2:
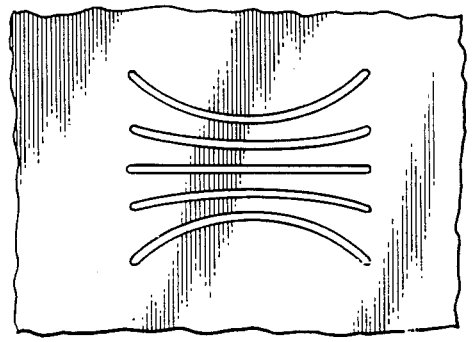
Figure 3:
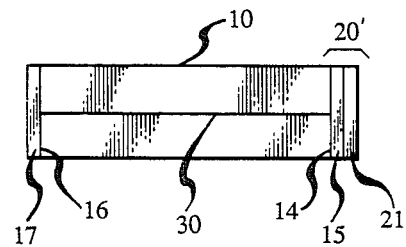
Figure 4:
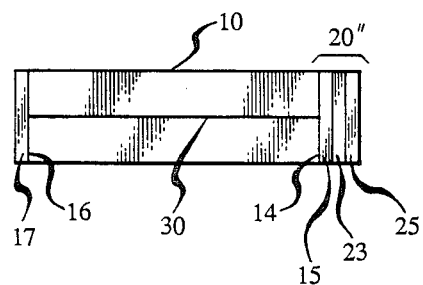

In particular, the filter means 20 may take on other forms which do not require a grooved layer 19 of the type shown in FIGS. 1 and 2. Thus, in FIGS. 3 and 4, the solid state body 10, the surfaces 14 and 16, the waveguide 30 and the low reflectivity coatings 15 and 17 are comparable to those previously discussed, but the filter designs are different. Reflection filter 20' of FIG. 3 includes a polarization sensitive film 21 disposed on coating 15 so as to have a high transmissivity for the undesired mode (e.g., TM) and to reflect the desired mode (e.g., TE), thereby suppressing oscillation of the former in the resonator. On the other hand, reflection filter 20" of FIG. 4 the polarization sensitive film 23 is disposed on coating 15 so as to absorb the undesired mode (e.g., TM) and transmit the desired mode (e.g., TE). While this much of the structure suppresses oscillation of the undesired mode in the resonator, in order to sustain oscillation of the desired mode a reflecting layer 25 is disposed on film 23. In general, the polarizing films comprise oriented polymers in which the molecules are oriented along a particular direction to affect (reflect, absorb, transmit) a particular mode. Such polymers are well known in the art; e.g., H-sheet which comprises polymeric molecules, including primarily iodine atoms, embedded in a plastic. The polarizing film may also be a discrete film affixed to the coating with a suitable adhesive (e.g., epoxy). From a manufacturing standpoint, however, it is preferred to deposit the film on the coating.

We claim:

1. A solid state laser comprising
   a solid state body including an optical resonator, a waveguide in which laser radiation propagates in TE and TM modes, the radiation being incident on a region of a first surface of the body, characterized by
   a reflection filter disposed on said first surface so as to preferentially reflect either TE or TM modes and to suppress oscillation within the resonator of the non-reflected modes.

2. The laser of claim 1 wherein said filter comprises a multi-layered structure in a portion of which a plurality of grooves are located so as to overlap said region and to preferentially reflect either TE or TM modes.

3. The laser of claim 1 wherein
   said waveguide has the shape of an elongated stripe having an asymmetric cross-section with one dimension longer than any other and which favors lasing in TE modes, and
   said grooves extend in the direction of said one dimension.

4. The laser of claim 3 wherein said grooves are parallel to one another and to said one dimension.

5. The laser of claim 4 wherein said grooves have an average pitch of about $\mu/2$, where $\mu$ is the wavelength of the laser radiation as measured in the portion of the structure in which the grooves are located.

6. The laser of claim 3 wherein said TE modes have curved wavefronts and said grooves are curved to approximate the shape of said wavefronts.

7. The laser of claims 1, 2, 3, 4, 5 or 6 wherein said laser is a buried heterostructure semiconductor laser.

8. The laser of claim 7 wherein said laser is a distributed feedback laser.

9. The laser of claim 8 wherein said body is a semiconductor body having a pair of parallel crystal facets one of which forms said first surface, and wherein said filter comprises a first antireflection coating on said first surface and a first higher refractive index or metal layer disposed on said coating, said grooves being located in said first layer, and further including a low reflectivity second coating on said other facet.

10. The laser of claim 9 wherein said grooves extend through said first layer so as to expose the underlying coating.

11. The laser of claim 9 including a passivation coating disposed on said first layer.

12. The laser of claim 9 further including a second higher refractive index or metal layer on said second coating, grooves also being located in said second layer.

13. The laser of claim 12 wherein said grooves in both said first and second layers extend in the same direction.

14. The laser of claim 12 wherein said grooves extend through said first and second layers so as to expose the underlying coatings.

15. The laser of claim 14 including a passivation coating disposed on each of said first and second layers.

16. The laser of claim 1 wherein said radiation is incident on a region of a second surface, and a reflection filter is also disposed on said second surface.

17. The laser of claim 1 wherein said reflection filter comprises a multi-layered structure including a polarization sensitive film which preferentially reflects either TE or TM modes and is transmissive to the non-reflected modes, thereby to suppress oscillation of the non-reflected modes in the resonator.

18. The laser of claim 1 wherein said reflection filter comprises a reflecting layer and a polarization sensitive film disposed between said body surface and said reflecting layer, said film being effective to absorb said non-reflected modes, thereby to suppress oscillation of said non-reflected modes in said resonator, and to transmit the other modes which are reflected by said reflecting layer to sustain their oscillation in said resonator.

19. The laser of claim 17 or 18 wherein said film comprises an oriented polymer.

* * * * *